US011735551B2

(12) United States Patent
Yao et al.

(10) Patent No.: US 11,735,551 B2
(45) Date of Patent: Aug. 22, 2023

(54) ALIGNED CORE BALLS FOR INTERCONNECT JOINT STABILITY

(71) Applicant: Intel Corporation, Santa Clara, CA (US)

(72) Inventors: Jimin Yao, Chandler, AZ (US); Shawna Liff, Scottsdale, AZ (US); Xin Yan, Chandler, AZ (US); Numair Ahmed, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1000 days.

(21) Appl. No.: 16/363,996

(22) Filed: Mar. 25, 2019

(65) Prior Publication Data

US 2020/0312803 A1 Oct. 1, 2020

(51) Int. Cl.
*H01L 23/00* (2006.01)

(52) U.S. Cl.
CPC .............. *H01L 24/17* (2013.01); *H01L 24/13* (2013.01); *H01L 24/81* (2013.01); *H01L 2224/13014* (2013.01); *H01L 2224/1319* (2013.01); *H01L 2224/1357* (2013.01); *H01L 2224/13147* (2013.01); *H01L 2224/13647* (2013.01); *H01L 2224/13655* (2013.01); *H01L 2224/1403* (2013.01); *H01L 2224/14505* (2013.01); *H01L 2224/171* (2013.01); *H01L 2224/812* (2013.01); *H01L 2224/81139* (2013.01); *H01L 2224/81815* (2013.01); *H01L 2924/014* (2013.01)

(58) Field of Classification Search
CPC ........................................................ H01L 24/17
See application file for complete search history.

(56) References Cited

U.S. PATENT DOCUMENTS

2011/0024904 A1* 2/2011 Egawa .................. H01L 25/105
257/E21.507

* cited by examiner

*Primary Examiner* — William A Harriston
(74) *Attorney, Agent, or Firm* — Schwabe, Williamson & Wyatt, P.C.

(57) ABSTRACT

Embodiments herein relate to systems, apparatuses, or processes directed to an interconnect joint that includes multiple core balls within a solder compound where the multiple core balls are substantially linearly aligned. The multiple core balls, which may include copper or be a polymer, couple with each other within the solder and form a substantially linear alignment during reflow. In embodiments, four or more core balls may be used to achieve a high aspect ratio interconnect joint with a tight pitch.

20 Claims, 12 Drawing Sheets

1000

902
967
913
904

1002 ATTACHING ONE OR MORE CORE BALLS, RESPECTIVELY, AT ONE OR MORE LOCATION ON A SIDE OF A FIRST SUBSTRATE.

1004 ATTACHING ONE OR MORE CORE BALLS, RESPECTIVELY, AT ONE OR MORE LOCATION ON A SIDE OF A SECOND SUBSTRATE, AND WHEREIN THE ONE OR MORE LOCATION ON THE SIDE OF THE FIRST SUBSTRATE CORRESPOND TO THE ONE OR MORE LOCATION ON THE SIDE OF THE SECOND SUBSTRATE.

1006 COUPLING THE ONE OR MORE CORE BALLS ON THE FIRST SUBSTRATE TO THE ONE OR MORE CORE BALLS ON THE SECOND SUBSTRATE.

1008 APPLYING A REFLOW PROCESS TO ALIGN, SUBSTANTIALLY LINEARLY, THE ONE OR MORE CORE BALLS AT EACH RESPECTIVE LOCATION TO FORM AN INTERCONNECT JOINT AT EACH RESPECTIVE LOCATION.

200

220 222 224 226 228 230

| Configuration | Pitch | BGA Diameter | BGA SRO | Joint height | Ratio (H/P) |
|---|---|---|---|---|---|
| Cu Pillar | 200 | NA | 130 (bottom) | 150 | 0.75 |
| SAC ball | 200 | 127 | 120 | 100 | 0.50 |
| joint by 2 core balls | 200 | 150 (110, 20) | 120 | 220 | 1.10 |
| joint by 2 core balls | 200 | 154 (114, 20) | 120 | 228 | 1.14 |
| joint by 3 core balls | 200 | 154 (114, 20) | 120 | 342 | 1.71 |
| joint by 4 core balls | 200 | 154 (114, 20) | 120 | 456 | 2.28 |
| joint by 2 core balls | 150 | 110 (70, 20) | 90 | 140 | 0.93 |
| joint by 2 core balls | 150 | 116 (76, 20) | 90 | 152 | 1.01 |
| joint by 3 core balls | 150 | 116 (76, 20) | 90 | 228 | 1.52 |
| joint by 4 core balls | 150 | 116 (76, 20) | 90 | 304 | 2.03 |
| demo | 285 | 200 (160, 20) | 180 | 320 | 1.12 |

FIG. 2

ALIGNED CORE BALLS FOR INTERCONNECT JOINT STABILITY

FIELD

Embodiments of the present disclosure generally relate to the field of package assemblies, and in particular, package substrates that include interconnect joints.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Continued reduction in end product size of mobile electronic devices such as smart phones and ultrabooks is a driving force for the development of reduced size system in package components. Package on Package (PoP) is a widely adopted architecture configuration and has the capability to integrate system-on-a-chip (SoC) and memory functions in small package volume at low-cost. Integrating these and other components may use interconnect joints.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2 describes non-limiting examples and features of various interconnect joint strategies, including interconnect joints that use core balls, in accordance with embodiments.

DETAILED DESCRIPTION

Figure 1B:
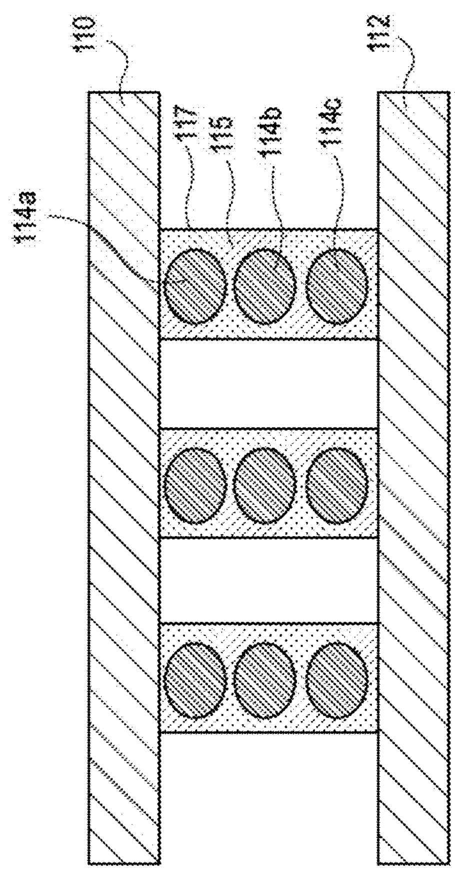
FIGS. 1A-1B illustrate examples of an interconnect joint that includes core balls that couple two substrates, in accordance with embodiments.

Embodiments of the present disclosure may generally relate to systems, apparatus, and/or processes directed to an interconnect joint that includes multiple core balls within a solder compound where the multiple core balls are substantially linearly aligned. The multiple core balls, which may include copper or a polymer, couple with each other within the solder and form a substantially linear alignment during reflow. In embodiments, four or more core balls may be used to achieve a high aspect ratio interconnect joint with a tight pitch. Embodiments may include using a core ball to core ball attachment within a solder to form a high aspect ratio interconnect joint that may be, for example, greater than a 1.1:1 height/pitch ratio. In embodiments, constructing an interconnect joint using core balls as described herein may allow for a greater height than the maximum height of legacy implementations of copper pillar-based interconnection joints. For example, a legacy 2-step copper pillar growth technology can make copper pillar 180 μm tall in a 200 μm pitch.

Embodiments in a package may include: a first substrate with a first side and a second side opposite the first side; a second substrate with a first side and a second side opposite the first side; and an interconnect joint to couple the second side of the first substrate with the first side of the second substrate, wherein the interconnect joint includes a plurality of core balls aligned substantially linearly to provide stability to the interconnect joint. Note: the techniques described herein may also be extended to ball on ball process, or process combinations of surface mount technology (SMT) and ball on ball.

Achieving high aspect ratio of interconnect joints with tight pitch is important for microelectronic packaging. In particular, for microelectronic integrated circuit designs robust interconnect joints between a SoC and a memory or an interposer with small package foot print is key for many packaging architectures including PoP. PoP is a widely adopted architecture configuration and has the capability to integrate SoC and memory functions in small package volume at low-cost.

In legacy implementations, the interconnects between a SoC and memory is accomplished using a solder filled through mold via (TMV) and solder balls. In addition, integrated fan-out PoP (InFO-POP) implementations could benefit from techniques described herein, where legacy implementations use copper pillar interconnect joints.

Legacy implementations that use via solder filled TMV and/or solder balls make it difficult to achieve high aspect ratio in tight pitch. An interconnect joint formed using TMV also has an end-of-life (EOL) yield issue and ball joint quality concerns caused by moisture evaporation, especially ball joint crack or partially open defects due to the solder balls being impacted by the package moisture escaping through the downstream thermal treatment process.

In the architecture configurations described above, interconnect height and pitch are important design parameters that allow the largest SoC die to fit in a small package foot print with desired die thickness.

Advantages of applying the techniques in embodiments described herein may include: a) achieving a high aspect ratio (>1.1:1 height/pitch ratio) interconnect between packages or within a package with tight pitch; b) the ability to manufacture different interconnect joint shapes, heights and pitches that are tunable through design of core ball, materials, and substrate; and c) the resulting interconnect joints can provide uniform joint co-planarity and ensure certain height post collapse. In embodiments, the collapse height of core balls is the height of the interconnect that may be made with multiple core balls through vertical connections, which is usually taller than those of normal SAC balls without cores.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Figure 1A:
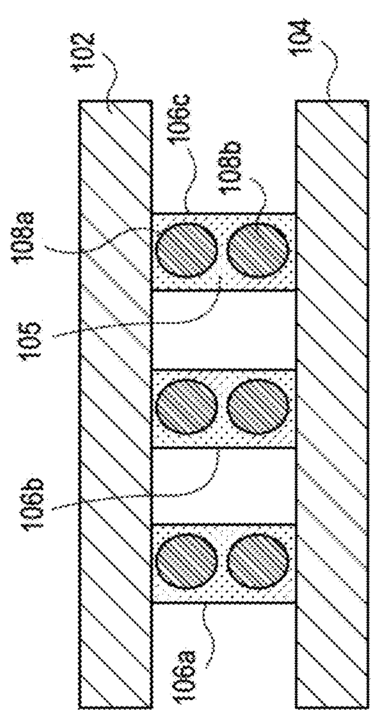

FIGS. 1A-1B illustrate examples of an interconnect joint that includes core balls that couple two substrates, in accordance with embodiments. FIG. 1A is an example package having a first substrate 102 and a second substrate 104 that are connected by three interconnect joints **106*a*-106*c*. An interconnect joint 106*c* includes two core balls 108*a*, 108*b* that are inside a volume of solder 105. In embodiments, the core balls 108*a*, 108*b* include materials that do not melt during the reflow process when the interconnect joint 106*c* is formed. Thus, a portion of the core balls 108*a*, 108*b* remain intact and suspended within the volume of solder 105**.

In embodiments, the core balls **108*a*, 108*b* may include copper or a polymer. In embodiments, the core balls 108*a*, 108*b*** may include a solder coating that melts during the reflow process. In embodiments, a copper core ball may be coated with a nickel layer to prevent the copper from encountering a solder depletion issue that may, over time, cause copper to eventually be etched away. In embodiments, a polymer core ball may be coated with copper or a nickel layer. Examples of polymers that may be used include but are not limited to plastic materials such as polyethylene (PE), polypropylene (PP), polystyrene (PS) and polyvinyl chloride (PVC). These materials may have good adhesion with metal coating layers.

In embodiments, within the interconnect joint **106*c*, the core balls 108*a*, 108*b* are substantially linearly aligned within the solder 105. In embodiments, the core balls 108*a*, 108*b* are substantially perpendicular to the plane of the substrate 102 or the plane of the substrate 104. The substantially linear alignment of the core balls 108*a*, 108*b* provide additional strength to the interconnect joint 106*c***, including compressive and/or tensile strength even with high aspect ratios.

FIG. 1B is an example package that includes an interconnect joint 117, that may be similar to interconnect joint **106*c* of FIG. 1A, that includes three core balls 114*a*-114*c* are substantially linearly aligned within the solder 115. In embodiments, the interconnect joint 117 is taller than the interconnect 106*c*, facilitating a greater distance between the first substrate 110 and the second substrate 112. By using three core balls 114*a*-114*c*, the interconnect joint 117 is able to provide a stronger support between the substrates than the solder 115 would otherwise alone. In embodiments, this increased strength does not require an increase in width of the interconnect joint 117. In embodiments discussed below, by continuing to add core balls within solder, interconnect joint 117 height may be greater than a corresponding maximum height of a legacy copper pillar implementation of an interconnect. It should be noted that each of the core balls 114*a*-114*c*** may be of different sizes and shapes, and may be made from different materials.

FIG. 2 describes non-limiting examples and features of various interconnect joint strategies, including interconnect joints that use core balls, in accordance with embodiments. Diagram 200 shows a table of results of tests performed using various interconnect strategies. The table 200 describes configurations including calculations of joint height ball predicted from ball on ball process, ball on package applications or process combinations. Table 200 includes, for the various examples, configuration 220, pitch 222, which may refer to the center to center distance between consecutive balls on a ball grid array (BGA) package, BGA Diameter 224 which is the diameter of a core ball, e.g. 150 (110, 20) means that the outer diameter of the core ball is 150 μm with 110 μm core diameter and 20 μm shell solder coating, BGA solder resist opening (SRO) 226, Joint Height 228, and Ratio (H/P) 230 indicating the aspect ratio of the interconnect joint height to pitch. As can be seen from table 200, the copper pillar and tin-silver-copper (SnAgCu) lead-free solder (SAC) implementations of an interconnect joint have an aspect ratio 0.75 and 0.5, respectively. This is far less than the aspect ratios of the tests of the interconnect joints having two or more core balls, which rains from 0.93 to 2.28.

This high aspect ratio joint can be extended to fine pitch array. As shown, the pitch can be extended to 150 μm pitch to reach 160 μm height using 2 ball joints or double the height using 4 ball joints.

Figure 3A:
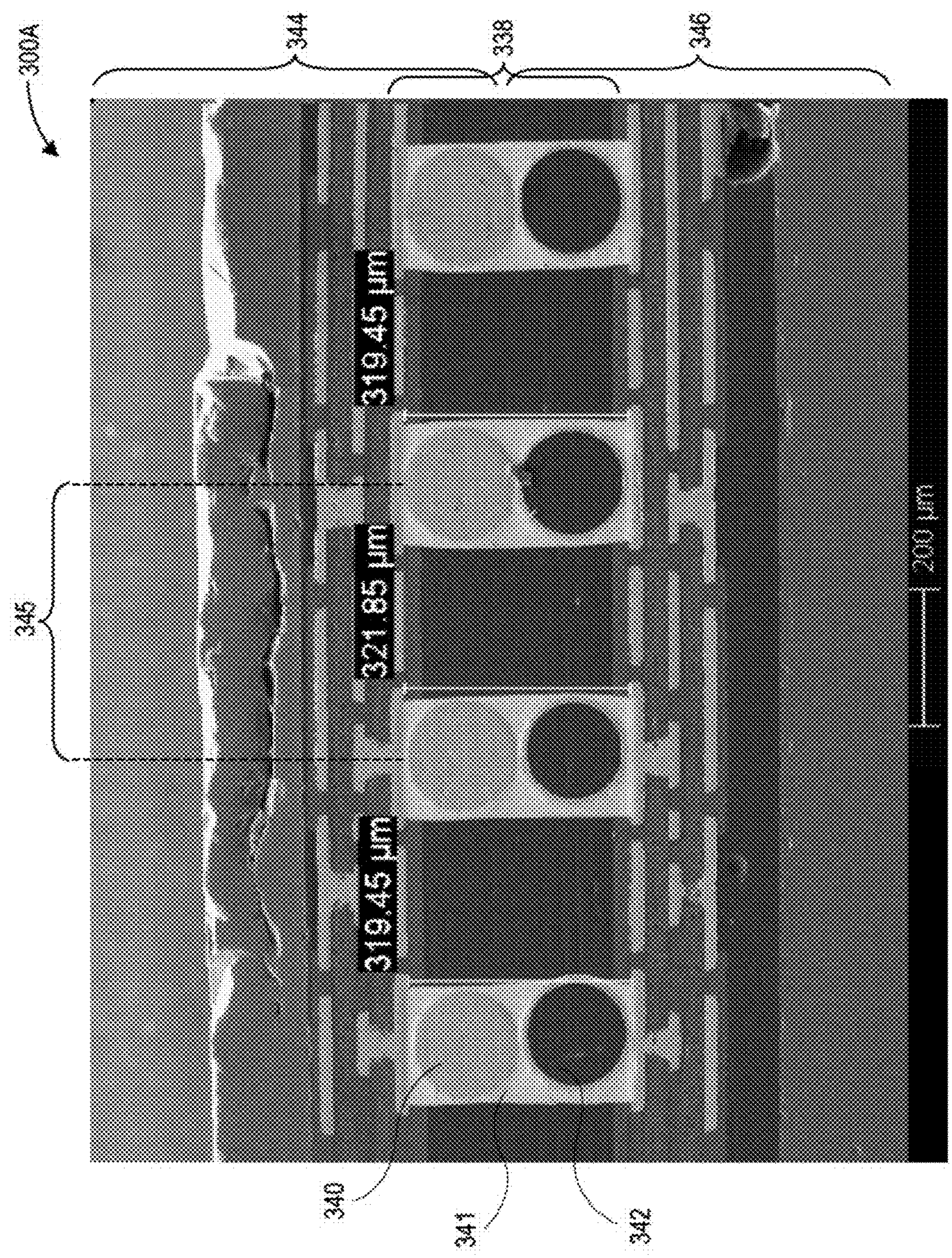
FIGS. 3A-3C illustrate various examples of package to package interconnect joints created using core balls, including cross-sections and x-rays, in accordance with embodiments.
Figures 3B, 3C:
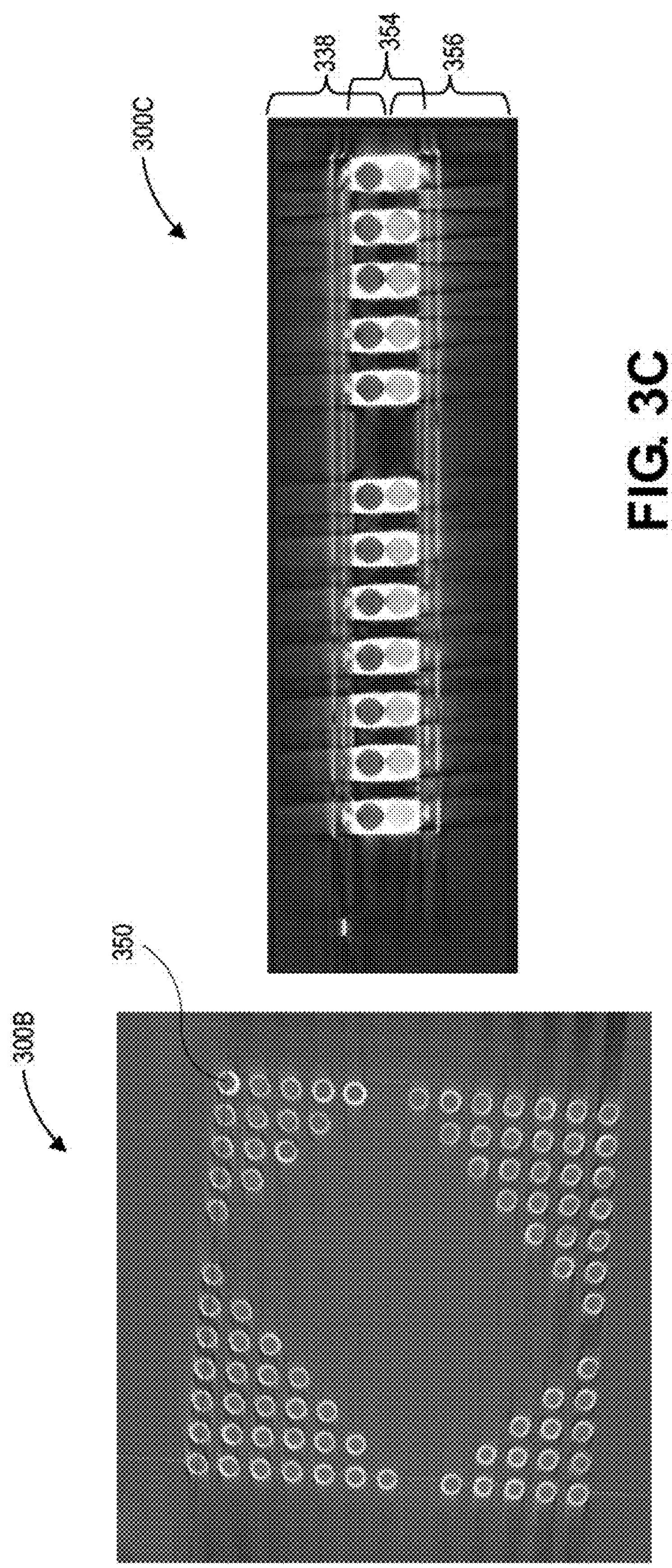

FIGS. 3A-3C illustrate various examples of package to package interconnect joints created using core balls, including cross-sections and x-rays, in accordance with embodiments. With respect to FIG. 3A, diagram 300A shows an example of a package to package interconnect with an approximately 320 μm pad to pad height 338 on 285 μm minimum pitch BGA array was formed with core balls 340, 342. Solder 341 encapsulates the core balls 340, 342.

As shown, the package 300A has 285 μm minimum pitch 345 spacing between ball joint center to ball joint center and 180 μm SRO BGA. As shown, 8 mil diameter copper core balls 340 with 160 μm diameter core and 8 mil diameter polymer core balls 342 with 160 μm diameter core are attached to separate packages 344, 346, then the copper core ball attached package 346 is attached onto polymer core ball attached package 344 through a CAM process to make this high aspect ratio interconnect. A CAM process bonds a die onto a substrate in room temp and then performs reflow in an oven to make the joints between die and substrate. The combination of different diameter and/or core materials can also be used besides the core balls used in the structure. Both the CAM and a thermal compression bonding (TCB) process can also be used to tune the joint height and shape by, for example, controlling the alignment offset of the core ball joints and joint collapse height range in both bonding processes to tune the joint height and shape. A TCB process bonds a die to the substrate by flattening the die and substrate at desired temperatures and vacuum, and then by bonding the die to the substrate under constant force while the die is heated up quickly beyond the solidus temperature to form the joints between die and substrate, then cools down to finish the bonding process. Note: the 320 μm height 338 is beyond what is achievable by legacy methods of copper pillar, through mold via, and solder balls.

FIGS. 3B and 3C show 3D X-ray large area scanning images show that uniform joints are formed across the 4×4 mm unit. FIG. 3B shows diagram 300B which is a top-down x-ray view of the package 300A, with a core ball 350 that may be similar to core ball 340 of diagram 300A. FIG. 3C shows a diagram that is a side view of the package 300A, with a pad height 338 that couples a first package 356, which may be similar to package 346 of diagram 300A, with package 354, which may be similar to package 344 of diagram 300A.

Figure 4:
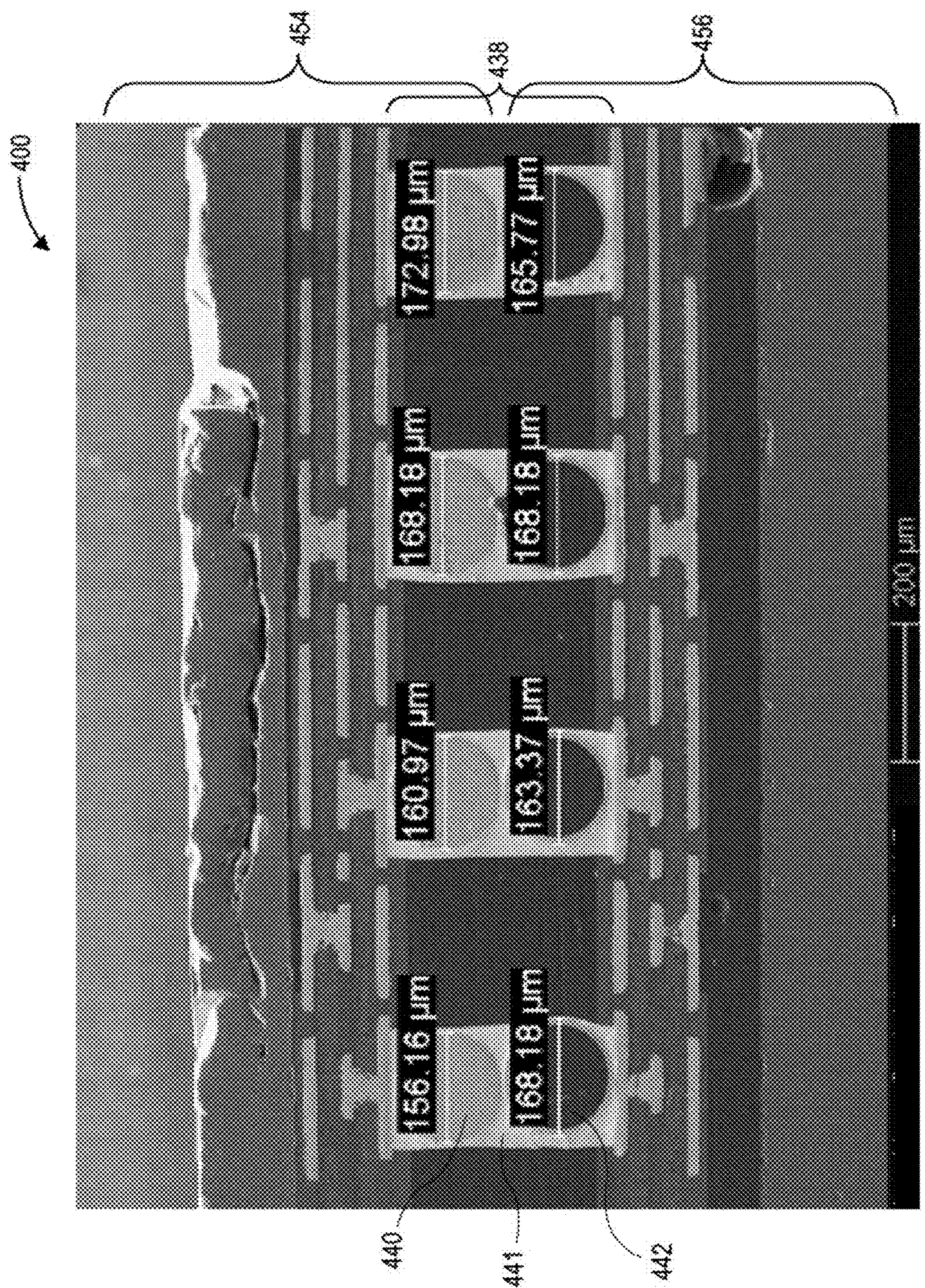
FIG. 4 illustrates another example of a package to package interconnect joint created using core balls, in accordance with embodiments.

FIG. 4 illustrates another example of a package to package interconnect joint created using core balls, in accordance with embodiments. Diagram 400 shows a package to package interconnect on 285 μm minimum pitch BGA array 438 made by attaching a first package 454 with 8 mil diameter copper core ball 440 onto a second package 456 having with 8 mil diameter polymer core ball 442. The core diameters of both core balls are approximately 160 μm.

The diameter of the joint formed is ~170 μm which is less than 285 μm pitch, which indicates that the larger diameter core balls can be used in this pitch to increase the interconnect height. Furthermore, this interconnect can be applied to even tighter pitch. EDS analysis confirmed that this high aspect ratio joint are formed by melted solder surrounding two separated cores head to head in vertical direction, indicating that the surface energy is strong enough to hold two separated core balls 440, 442 remaining in its placement position during the solder melting process.

Figure 5:
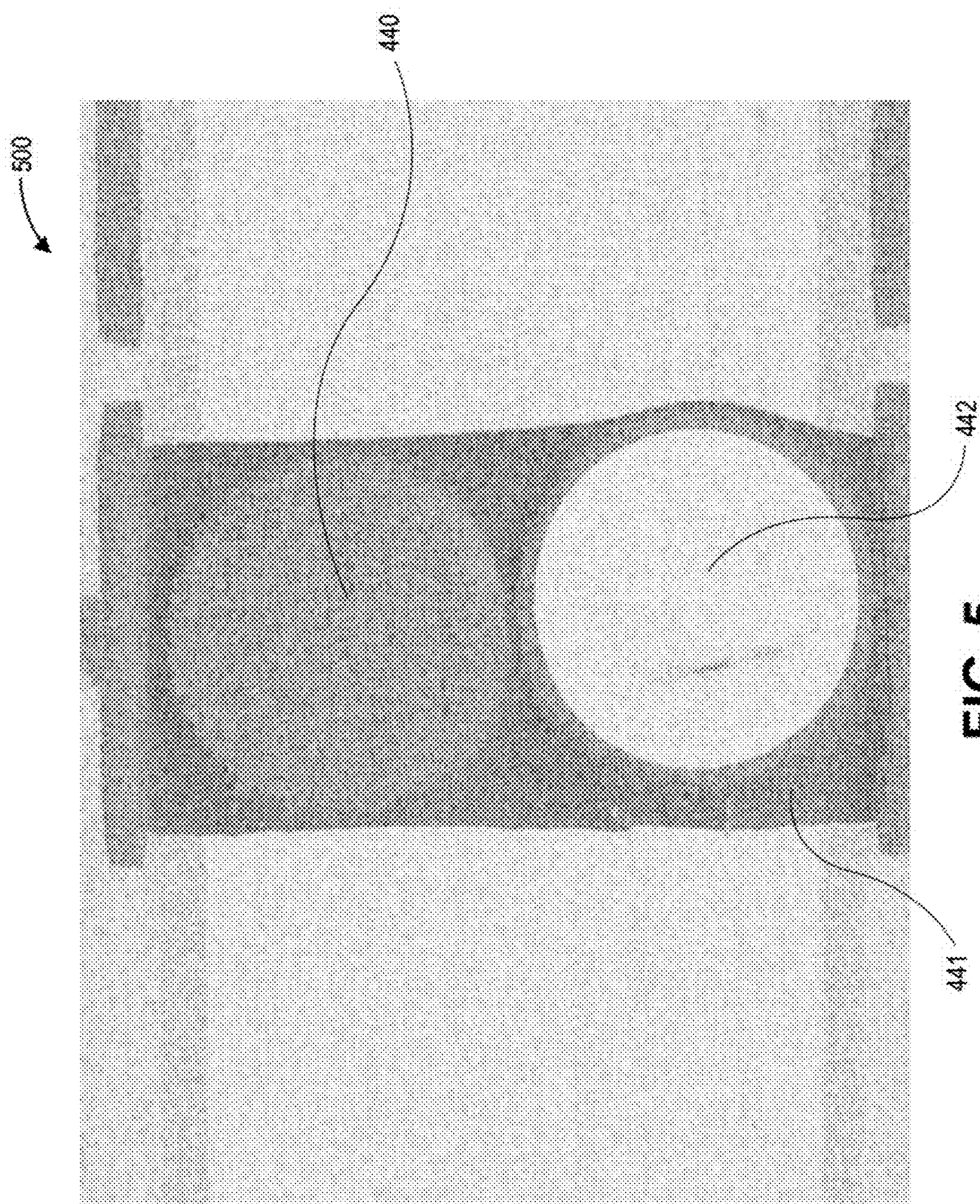
FIG. 5 illustrates an energy-dispersive X-ray spectroscopy (EDS) image of a high aspect ratio package to package interconnect joint created using core balls, in accordance with embodiments.

FIG. 5 illustrates an energy-dispersive X-ray spectroscopy (EDS) image of a high aspect ratio package to package interconnect joint created using core balls, in accordance with embodiments. Diagram 500 is an EDS image of packaging of FIG. 4 that shows that the high aspect ratio package to package interconnect are formed by melted solder 441 with two separated cores 440, 442 buried inside.

Figure 6:
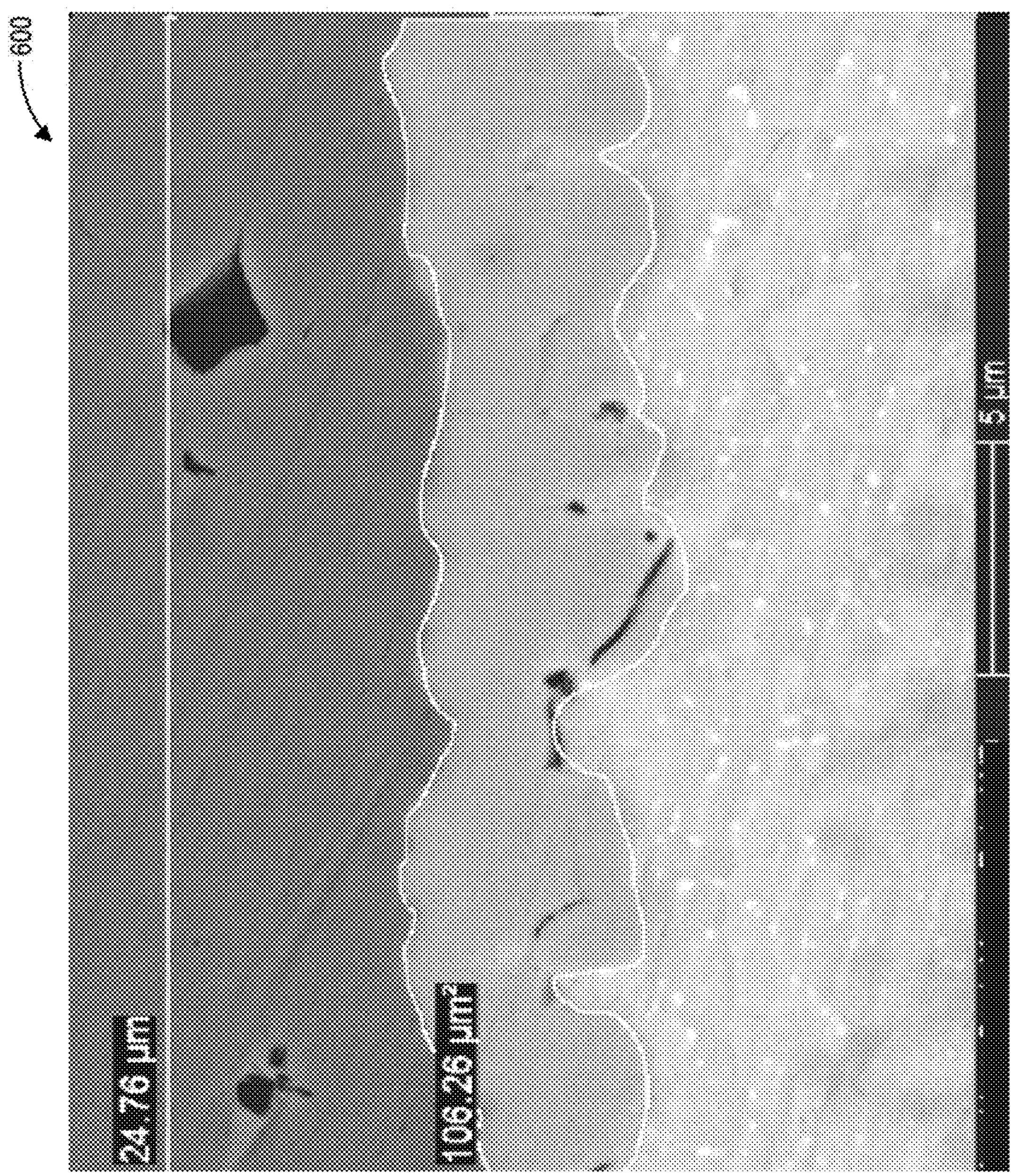
FIG. 6 illustrates an intermetallic compound (IMC) microstructure analysis showing thickness and voids levels of an interconnect joint created using core balls, in accordance with embodiments.

FIG. 6 illustrates an IMC microstructure analysis showing thickness and voids levels of an interconnect joint created using core balls, in accordance with embodiments. Diagram 600 is an IMC microstructure analysis of FIG. 4, and shows that the IMC thickness and low voids level of this joint is normal. The IMC of the joints between the core balls and through to the substrate is healthy.

Figure 7A:
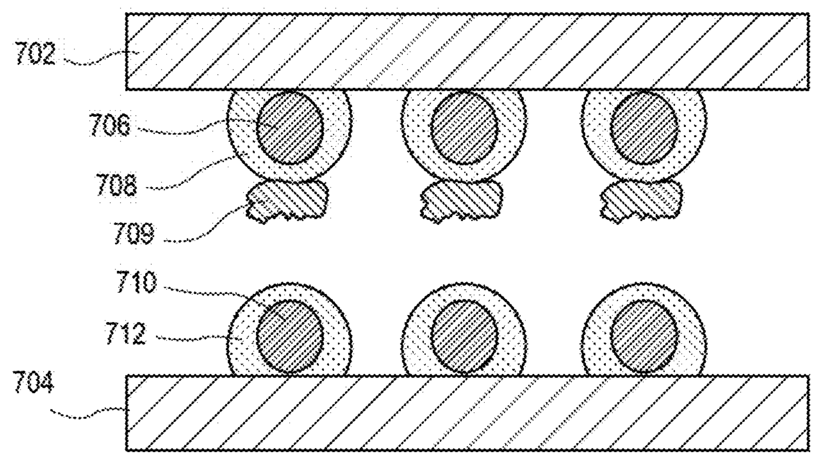
FIG. 7A-7C illustrate various assembly stages in a process for manufacturing a package with an interconnect joint having two core balls, in accordance with embodiments.
Figure 7B:
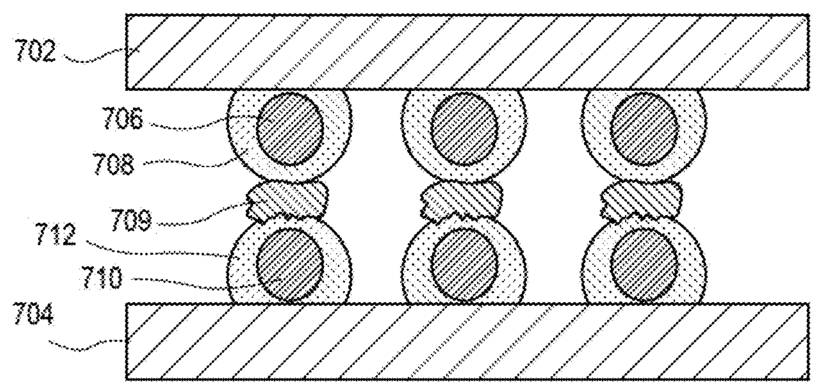
Figure 7C:
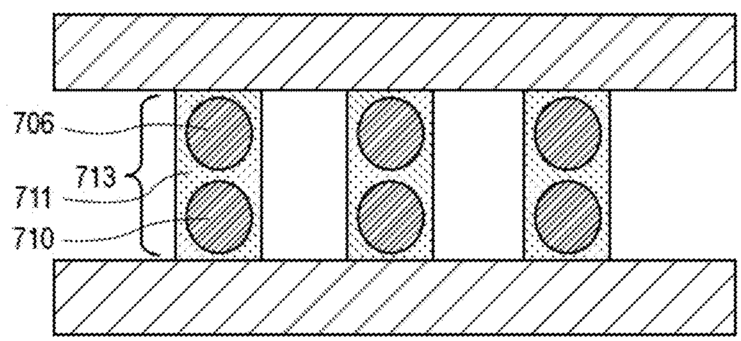

FIG. 7A-7C illustrate various assembly stages in a process for manufacturing a package with an interconnect joint having two core balls, in accordance with embodiments. FIG. 7A shows a plurality of core balls 706 that are applied to a first surface of a substrate 702. As shown, the core balls 706 may be encased in solder 708 that surrounds or substantially surrounds the core balls 706. A flux 709 may be applied to the solder 708 coated core balls 706 prior to reflow. In embodiments, the flux 709 may be some other paste to facilitate subsequent reflow.

Similarly, a core ball 710 that may be surrounded in solder 712 may be coupled with the second substrate 704. In embodiments, a core ball may include copper or a polymer. In embodiments, a copper core ball may have a nickel plating or a plating of some other material to keep the copper from encountering a solder depletion issue. A polymer core ball may have a copper or a nickel plating, or a plating of some other material.

FIG. 7B shows the first substrate 702 and the second substrate 704 being coupled. In embodiments, the flux 709 may be directly contacting the solder 708 that surrounds the core balls 706, and also may be directly contacting the solder 712 that surrounds the core balls 710.

FIG. 7C shows the result of a thermal treatment process applied to FIG. 7B to create a post thermal treatment collapse joint structure. As a result, the interconnect joint 713 may be formed as a result of the solder 708 and 712 melting and consuming the flux 709. In embodiments, the melted solder 711 will have the effect of coupling the core balls 706, 710 within the solder and aligning them substantially linearly within the solder 711. The existence of the core balls 706, 710 within the interconnect joint 713 substantially increase the compression and tensile strength of the interconnect joint 713.

It should be noted that the techniques described herein may be extended beyond package to package joint or SMT. For example, ball on ball process or the combination of ball on ball process and SMT can be used to enable high aspect ratio interconnects.

Figure 8A:
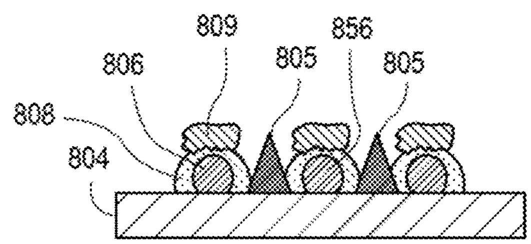
FIG. 8A-8E illustrate various assembly stages in a process for manufacturing a package with an interconnect joint having three core balls, with spacers, in accordance with embodiments.

FIG. 8A-8E illustrate various assembly stages in a process for manufacturing a package with an interconnect joint having three core balls, with spacers, in accordance with embodiments. FIG. 8A shows a plurality of core balls 806 applied to a first side of the substrate 804 in embodiments, the core balls 806 may be encased fully or substantially in a solder 808. A flux 809 may be applied to a portion of the solder 808 surrounding the core balls 806 to facilitate connections during a subsequent heating or reflow. In embodiments, spacers 805 may be coupled with the substrate 804 separating the core balls 806, 856. The spacer 805 may include molding, an ink barrier, or other suitable material that may be used to prevent the solder 808 from flowing into the core ball 856 and electrically coupling the core ball 806 with the core ball 856 during a heating or a reflow process to melt the solder 808. The spacer 805 prevents the core ball 806 from jointing with the core ball 856.

Figure 8B:
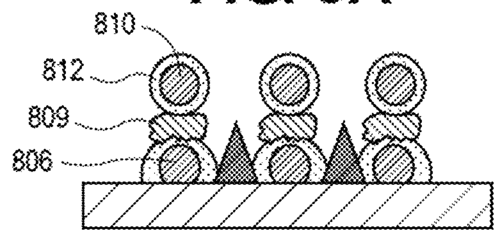

FIG. 8B shows an additional core ball 810, that may be surrounded by solder 812, coupled with the flux 809. In embodiments, the core balls 806, 810 may be roughly oriented in a line substantially perpendicular to the substrate 804.

Figure 8C:
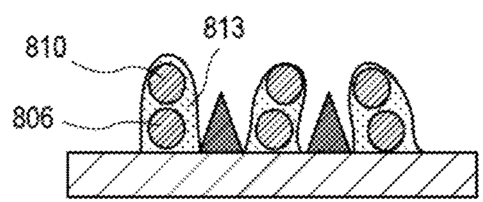

FIG. 8C shows the result of a heating or reflow process that results in the coupling of core balls 806, 810 within the solder volume 813. As shown in FIG. 8C, the result of this heating process may cause the core balls 806, 810 to be no longer in a substantially perpendicular line with respect to substrate 804. This may be due to varying temperatures of heat applied, or due to air or other substances blowing against the core balls 806, 810 during heating and/or cooling.

Figure 8D:
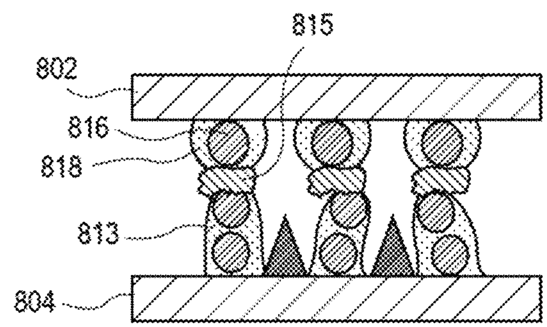

FIG. 8D shows a second substrate 802 that has a plurality of core balls 816 that may be respectively surrounded by solder 818 that are attached to the substrate 804 that includes the various components from FIG. 8C. An additional amount of flux 815 may be applied to a surface of the solder volume 813 and the solder 818 to facilitate coupling during reflow.

Figure 8E:
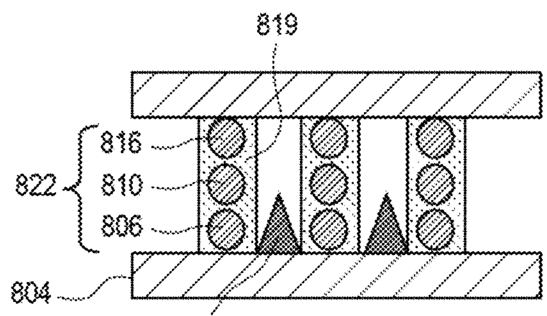

FIG. 8E shows the result of a heating or reflow process that results in the coupling of core balls 806, 810, 816 within the solder volume 819 to form an interconnect joint 822. During the heating or reflow process, the solder volume 813 combines with the solder 818 around the core ball 816. As a result, the surface tension of the solder 819, in conjunction with a lifting and/or separating of the two substrates 802, 804 will cause the core balls 806, 810, 816 to align vertically, even if some of the core balls 806, 810 as shown in FIG. 8C, were originally out of alignment. In embodiments, the spacers 805, if used at all, may remain attached to substrate 804 or may be removed. In other embodiments, spacers 805 may not be used.

Figure 9A:
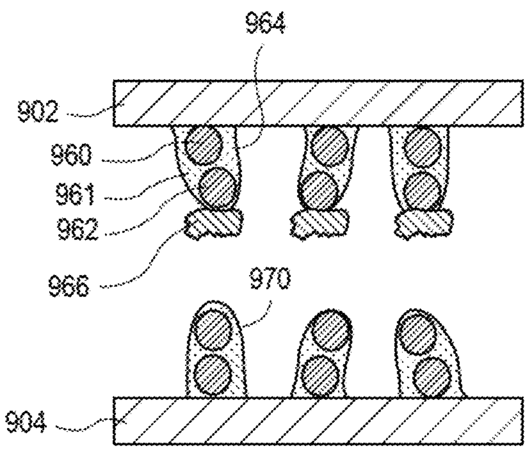
FIG. 9A-9C illustrate various assembly stages in a process for manufacturing a package with an interconnect joint having four core balls, in accordance with embodiments.
Figure 9B:
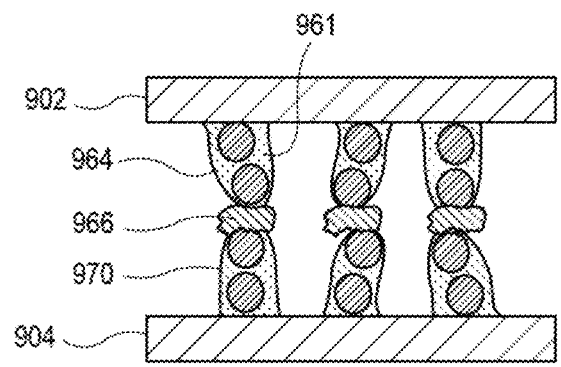
Figure 9C:
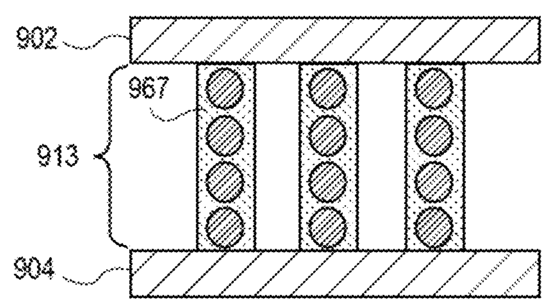

FIG. 9A-9C illustrate various assembly stages in a process for manufacturing a package with an interconnect joint having four core balls, in accordance with embodiments. FIG. 9A shows a first substrate 902 with a group of multiple core balls 964 at various locations on the substrate 902. The multiple core balls 964 may include core balls 960, 962 that are partially or completely encapsulated within solder 961. In embodiments, the multiple core balls 964 may be created using techniques similar to those described with respect to FIG. 8A-8D.

Substrate 904 may also include groups of multiple core balls 970, at various locations, that may correspond to the locations of the multiple core balls 964 with respect to substrate 902. A flux 966 may be applied to a portion of the multiple core balls 964.

FIG. 9B shows the substrates 902, 904 have been brought together such that the multiple core balls 964 of substrate 902 are in contact with the corresponding multiple core balls 970 through the flux 966. At this point, the individual core balls are not in alignment, and that the solder 961 may not be uniformly distributed around the individual core balls.

FIG. 9C shows the partial package of FIG. 9B after it has gone through a heating and/or reflow process. As a result, the surface tension of the solder 967, in conjunction with a lifting and/or separating of the two substrates 902, 904 may cause the core balls within the interconnect joints 913 to align vertically. In addition, the solder 967 may spread uniformly around the core balls to create a high aspect ratio interconnect joints 913.

Figure 10:
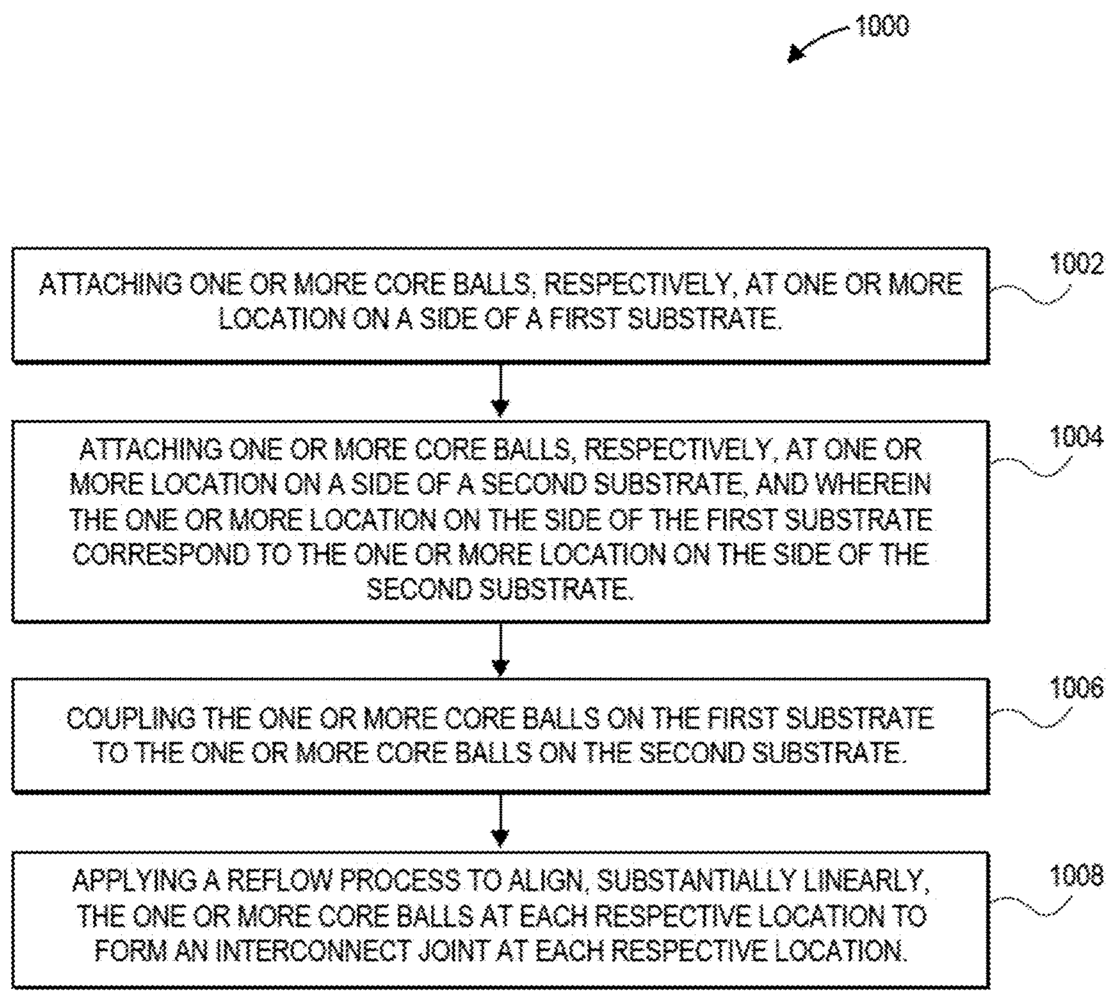
FIG. 10 illustrates an example process for manufacturing a package assembly with an interconnect joint having core balls, in accordance with embodiments.

FIG. 10 illustrates an example process for manufacturing a package assembly with an interconnect joint having core balls, in accordance with embodiments. Process 1000 may be performed by one or more elements, techniques, or systems that may be found in FIG. 1A-9C.

At block 1002, the process may include attaching one or more core balls, respectively, at one or more location on a side of a first substrate. In embodiments, the first substrate may at least correspond to substrate 102 of FIG. 1A, substrate 110 of FIG. 1B, substrate 702 of FIGS. 7A-7C, substrate 802 of FIGS. 8A-8E, or substrate 902 of FIGS. 9A-9C. In embodiments, the core balls may at least correspond to core ball 108*a* of FIG. 1A, 114*a* of FIG. 1B, core ball 706 of FIGS. 7A-7C, core ball 816 of FIGS. 8A-8E, or core ball 960 of FIGS. 9A-9C.

At block 1004, the process may include attaching one or more core balls, respectively, at one or more location on a side of a second substrate, and wherein the one or more location on the side of the first substrate correspond to the one or more location on the side of the second substrate. In embodiments, the second substrate may at least correspond to substrate 104 of FIG. 1A, substrate 112 of FIG. 1B, substrate 704 of FIGS. 7A-7C, substrate 804 of FIGS. 8A-8E, or substrate 904 of FIGS. 9A-9C. In embodiments, the core balls may at least correspond to core ball 108*b* of FIG. 1A, 114*c* of FIG. 1B, core ball 710 of FIGS. 7A-7C, core ball 806, 810 of FIGS. 8A-8E, or core balls included within 970 of FIGS. 9A-9C. The one or more location on the side of the first substrate correspond to the one or more location on the side of the second substrate may be found at least at FIG. 7A and FIG. 9A.

At block 1006, the process may include coupling the one or more core balls on the first substrate to the one or more core balls on the second substrate. In embodiments, the coupling of the one or more core balls on the first substrate to the one or more core balls on the second substrate may correspond at least to techniques described with respect to FIG. 7B, FIG. 8D, and FIG. 9B. In embodiments, the coupling may include the insertion of a flux, such as flux 709 of FIG. 7B, 815 of FIG. 8D, and 966 of FIG. 9B. In embodiments, the flux may also be a paste.

At block 1008, the process may include applying a reflow process to align, substantially linearly, the one or more core balls at each respective location to form an interconnect joint at each respective location. In embodiments, the reflow process may include exposing the package to heat to cause solder to melt. In embodiments, applying a reflow process may correspond at least two techniques described with respect to FIG. 1A-1B, FIG. 7C, FIG. 8E, FIG. 9C.

Figure 11:
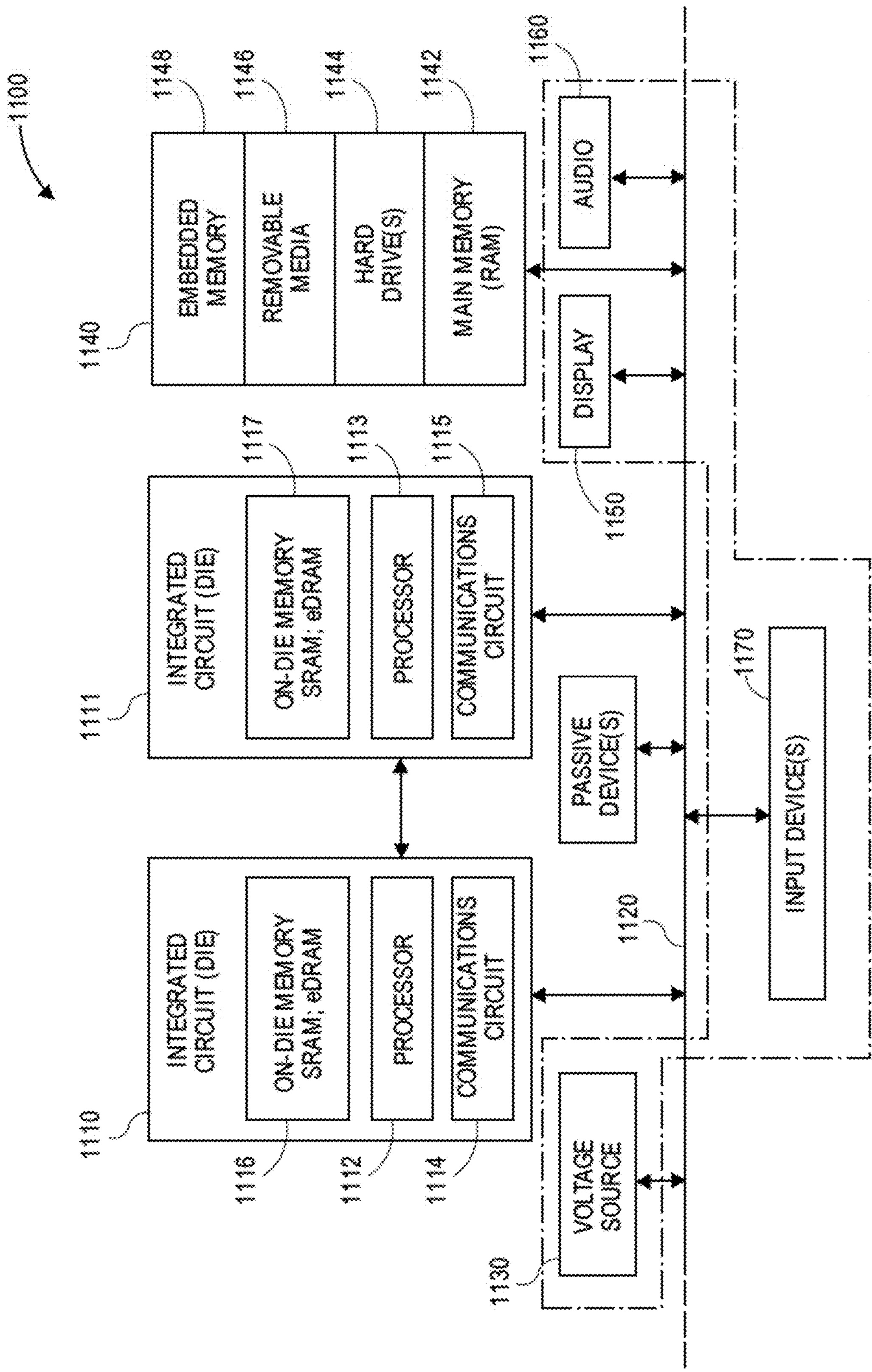
FIG. 11 schematically illustrates a computing device, in accordance with embodiments.

FIG. 11 schematically illustrates a computing device, in accordance with embodiments. The computer system 1100 (also referred to as the electronic system 1100) as depicted can embody aligned core balls for interconnect joint stability, according to any of the several disclosed embodiments and their equivalents as set forth in this disclosure. The computer system 1100 may be a mobile device such as a netbook computer. The computer system 1100 may be a mobile device such as a wireless smart phone. The computer system 1100 may be a desktop computer. The computer system 1100 may be a hand-held reader. The computer system 1100 may be a server system. The computer system 1100 may be a supercomputer or high-performance computing system.

In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 includes, or is coupled with, aligned core balls for interconnect joint stability, as disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1110 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as the first die in a die stack, according to an embodiment.

In an embodiment, the electronic system 1100 also includes a display device 1150, an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including a package substrate having aligned core balls for interconnect joint stability, according to any of the several disclosed embodiments and their equivalents, an electronic system, a computer system, one or more methods of fabricating an integrated circuit, and one or more methods of fabricating an electronic assembly that includes a package substrate having aligned core balls for interconnect joint stability, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having aligned core balls for interconnect joint stability embodiments and their equivalents. A foundation substrate may be included, as represented by the dashed line of FIG. 11. Passive devices may also be included, as is also depicted in FIG. 11.

EXAMPLES

The following paragraphs describe examples of various embodiments.

Example 1 is an apparatus comprising: a volume of solder having a first end and a second end opposite the first end; a plurality of core balls disposed within the volume of solder, wherein the plurality of core balls are in a substantially linear alignment from a first location in the volume of solder proximate to the first end to a second location in the volume of solder proximate to the second end; and wherein the plurality of core balls are to increase the compressive or tensile strength of the apparatus.

Example 2 may include the apparatus of example 1, wherein the first end is to attach to a first substrate and the second end is to attach to a second substrate.

Example 3 may include the apparatus of any one of examples 1-2, wherein the core ball includes copper or a polymer.

Example 4 may include the apparatus of example 3, wherein the core ball includes a copper, a nickel, or a solder plating.

Example 5 may be a package comprising: a first substrate with a first side and a second side opposite the first side; a second substrate with a first side and a second side opposite the first side; and an interconnect joint to couple the second side of the first substrate with the first side of the second substrate, wherein the interconnect joint includes a plurality of core balls aligned substantially linearly to provide stability to the interconnect joint.

Example 6 may include the package of example 5, wherein the plurality of core balls are within a solder compound.

Example 7 may include the package of example 5, further including one or more second interconnect joint to couple the second side of the first substrate with the first side of the second substrate, wherein the one or more second interconnect joint includes, respectively, a plurality of core balls aligned substantially linearly to provide stability to the one or more second interconnect joint.

Example 8 may include the package of example 7, further including one or more spacers between the plurality of interconnect joints to prevent solder from intermixing between the interconnect joints.

Example 9 may include the package of example 5, wherein a core ball includes copper or polymer.

Example 10 may include the package of example 9, wherein a copper core ball includes a nickel plating.

Example 11 include the package of example 7, wherein a polymer core ball includes a copper, a nickel, or a solder plating.

Example 12 may include the package of example 5, wherein a core ball has a substantially spherical shape.

Example 13 may include the package of example 5, wherein the plurality of core balls respectively have different diameters or include different materials.

Example 14 include the package of example 5, wherein the first substrate and the second substrate are substantially parallel.

Example 15 include the package of example 5, wherein the diameter of a core ball is between 6 mils and 12 mils.

Example 16 is a method comprising: attaching one or more core balls, respectively, at one or more locations on a side of the first substrate; attaching one or more core balls, respectively, at one or more locations on a side of the second substrate, and wherein the one or more locations on the side of the first substrate correspond to the one or more locations on the first of the second substrate; and coupling the one or more core balls on the first substrate to the one or more core balls on the second substrate.

Example 17 may include the method of example 16, wherein the core balls are encapsulated in solder.

Example 18 may include the method of example 16, wherein coupling the one or more core balls on the first substrate to the one or more core balls on the second substrate further includes: applying a flux or paste to at least a portion of the one or more core balls; aligning the side of the first substrate and side of the second substrate so that at least one of the one or more core balls on the side of the first substrate are in direct contact with the one or more core balls on the side of the second substrate.

Example 19 may include the method of example 18, wherein coupling the one or more core balls on the first substrate to the one or more core balls on the second substrate further includes applying heat to cause a reflow of solder coupled with the one or more core balls to substantially linearly align the core balls.

Example 20 may include the method of any one of example 16-19, wherein a core ball attached at a location on a side of the first or second substrate further includes two or more core balls attached at the location, wherein the two or more core balls are aligned substantially linearly in a direction generally perpendicular to the first or the second substrate.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:

a volume of solder having a first end and a second end opposite the first end; and a plurality of core balls disposed within the volume of solder, wherein the plurality of core balls are in a substantially linear alignment from a first location in the volume of solder proximate to the first end to a second location in the volume of solder proximate to the second end, wherein a first one of the plurality of core balls has a first total material composition, and a second one of the plurality of core balls has a second total material composition, the second total material composition different from the first total material composition.

2. The apparatus of claim 1, wherein the first end is to attach to a first substrate and the second end is to attach to a second substrate.

3. The apparatus of claim 1, wherein one or more of the plurality of core balls includes copper or a polymer.

4. The apparatus of claim 3, wherein one or more of the plurality of core balls includes a copper, a nickel, or a solder plating.

5. A package comprising:

a first substrate with a first side and a second side opposite the first side;

a second substrate with a first side and a second side opposite the first side; and an interconnect joint to couple the second side of the first substrate with the first side of the second substrate, wherein the interconnect joint includes a plurality of core balls aligned substantially linearly to provide stability to the interconnect joint, wherein a first one of the plurality of core balls has a first total material composition, and a second one of the plurality of core balls has a second total material composition, the second total material composition different from the first total material composition.

6. The package of claim 5, wherein the plurality of core balls are within a solder compound.

7. The package of claim 5, further including one or more second interconnect joint to couple the second side of the first substrate with the first side of the second substrate, wherein the one or more second interconnect joint includes, respectively, a plurality of core balls aligned substantially linearly to provide stability to the one or more second interconnect joint.

8. The package of claim 7, further including one or more spacers between the plurality of interconnect joints to prevent solder from intermixing between the interconnect joints.

9. The package of claim 5, wherein one or more of the plurality of core balls includes copper or polymer.

10. The package of claim 5, wherein one or more of the plurality of core balls is a copper core ball that includes a nickel plating.

11. The package of claim 5, wherein one or more of the plurality of core balls is a polymer core ball that includes a copper, a nickel, or a solder plating.

12. The package of claim 5, wherein one or more of the plurality of core balls is a core ball that has a substantially spherical shape.

13. The package of claim 5, wherein the plurality of core balls respectively have different diameters.

14. The package of claim 5, wherein the first substrate and the second substrate are substantially parallel.

15. The package of claim 5, wherein the diameter of a core ball is between 6 mils and 12 mils.

16. A method comprising:

attaching one or more core balls, respectively, at one or more locations on a side of the first substrate;

attaching one or more core balls, respectively, at one or more locations on a side of the second substrate, and wherein the one or more locations on the side of the first substrate correspond to the one or more locations on the first of the second substrate; and coupling the one or more core balls on the first substrate to the one or more core balls on the second substrate, wherein the one or more core balls on the first substrate each has a first total material composition, and the one or more core balls on the second substrate each has a second total material composition, the second total material composition different from the first total material composition.

17. The method of claim 16, wherein the core balls are encapsulated in solder.

18. The method of claim 16, wherein coupling the one or more core balls on the first substrate to the one or more core balls on the second substrate further includes:

applying a flux or paste to at least a portion of the one or more core balls;

aligning the side of the first substrate and side of the second substrate so that at least one of the one or more core balls on the side of the first substrate are in direct contact with the one or more core balls on the side of the second substrate.

19. The method of claim 18, wherein coupling the one or more core balls on the first substrate to the one or more core balls on the second substrate further includes applying heat to cause a reflow of solder coupled with the one or more core balls to substantially linearly align the core balls.

20. The method of claim 16, wherein a core ball attached at a location on a side of the first or second substrate further includes two or more core balls attached at the location, wherein the two or more core balls are aligned substantially linearly in a direction generally perpendicular to the first or the second substrate.

* * * * *